United States Patent
Djordjevic et al.

(10) Patent No.: US 8,381,065 B2
(45) Date of Patent: Feb. 19, 2013

(54) MODIFIED PROGRESSIVE EDGE-GROWTH LDPC CODES FOR ULTRA-HIGH-SPEED SERIAL OPTICAL TRANSPORT

(75) Inventors: Ivan B. Djordjevic, Tucson, AZ (US); Lei Xu, Princeton Junction, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 260 days.

(21) Appl. No.: 12/896,524

(22) Filed: Oct. 1, 2010

(65) Prior Publication Data
US 2012/0084617 A1 Apr. 5, 2012

(51) Int. Cl.
*H03M 13/00* (2006.01)
(52) U.S. Cl. ........ 714/755; 714/786; 714/794; 375/262; 375/341
(58) Field of Classification Search .................. 714/755, 714/786, 758, 794–795; 375/262, 341
See application file for complete search history.

(56) References Cited

U.S. PATENT DOCUMENTS

| | | | | |
|---|---|---|---|---|
| 2007/0136635 | A1* | 6/2007 | Niu et al. | 714/752 |
| 2010/0275099 | A1* | 10/2010 | Tan | 714/758 |
| 2011/0167315 | A1* | 7/2011 | Kyung et al. | 714/752 |

OTHER PUBLICATIONS

Batshon, H.G. et al., "Capacity Achieving Modulation Format for High-Speed Optical Networks", Optical Metro Networks and Short-Haul Systems II, edited by Werner Weiershausen, Benjamin Dingel, Achyut Kumar Dutta, Atul K. Srivastava, Proc. of SPIE vol. 7621, 76210M, 2010 SPIE, pp. 76210M1-76210M8.

Djordjevic, I.B. et al., "Large Girth Low-Density Parity-Check Codes for Long-Haul High-Speed Optical Communications", Optical Society of America, 2008, pp. 1-3.

Hu, X.Y. et al., "Regular and Irregular Progressive Edge-Growth Tanner Graphs", IEEE Transactions on Information Theory, vol. 51, No. 1, Jan. 2005, pp. 386-398.

* cited by examiner

*Primary Examiner* — Guy Lamarre
(74) *Attorney, Agent, or Firm* — Joseph Kolodka; James Bitetto (57) ABSTRACT

Systems and methods enabling ultra-high-speed optical transport The systems and methods include receiving a modulated, encoded input stream. Channel impairments are removed using MAP equalization. Symbols are detected in the input stream to produce a stream of encoded data. The stream of encoded data is decoded with one or more low density parity check (LDPC) decoders that use an LDPC code built by modified progressive edge growth. The LDPC code is built by iteratively expanding trees from each variable node until all check nodes are connected to the respective variable node, while controlling both the local girth and the global girth of the code.

20 Claims, 7 Drawing Sheets

MODIFIED PROGRESSIVE EDGE-GROWTH LDPC CODES FOR ULTRA-HIGH-SPEED SERIAL OPTICAL TRANSPORT

BACKGROUND

1. Technical Field

The present invention relates to forward error correction (FEC) for high-speed serial optical transport and, in particular, to systems and methods for FEC encoding with low density parity check codes based on a modified progressive edge growth (MPEG) method.

2. Description of the Related Art

In the recent years, with the rapid growth of data-centric services and the general deployment of broadband access networks, the dense wavelength division multiplexing (DWDM) network has been upgraded from 10 Gb/s per channel to more spectrally-efficient 40 Gb/s or 100 Gb/s per channel systems and beyond. 100 Gb/s Ethernet (100 GbE) is currently under standardization for both local area networks (LANs) and wide area networks (WANs). As the communication rate over a given medium increases, transmission becomes increasingly sensitive to errors due to various linear and nonlinear channel impairments such as chromatic dispersion, PMD and fiber nonlinearities. The Shannon limit for a noise-influenced channel describes a maximum amount of error-free data that can be transmitted with a specified bandwidth—it is therefore helpful to have robust codes and modulation schemes that closely approach the Shannon limit without imposing high requirements in terms of implementation cost and complexity.

Random low-density parity-check (LDPC) codes provide excellent error-correcting capabilities, but they are difficult to implement because of the lack of mathematical structure in their parity check matrices. Meanwhile, quasi-cyclic (QC) LDPC codes are easy to implement, but this comes at the expense of performance. To ameliorate the performance loss of structured LDPC codes, girth (the shortest cycle in the LDPC code parity check matrix's corresponding bipartite graph) is used as an optimization parameter. Large-girth QC-LDPC codes provide good bit-error rate (BER) performance, but require excessive codeword length for girths higher than 8.

SUMMARY

A method for receiving is shown that includes receiving a modulated, encoded input stream, detecting symbols in the input stream, equalizing the input stream to reduce channel impairments, and decoding the stream of encoded data with one or more low density parity check (LDPC) decoders using an LDPC code built controlling a local girth and a global girth.

A method for transmitting is shown that includes encoding one or more streams of input data with one or more low density parity check encoders configured to apply an LDPC code built controlling a local girth and a global girth to produce one or more encoded data streams, mapping the one or more encoded data streams to symbols, and modulating the symbols onto an optical carrier beam.

A receiver is shown that includes one or more detectors, each configured to extract symbols from a carrier beam and to output a coded stream, one or more log likelihood ratio (LLR) modules configured to generate LLR information for the respective coded streams, each comprising a lookup table configured to store correspondences between bit sequences and the symbols, and one or more decoder, each configured to accept a coded stream and the associated LLR information and to produce a decoded data stream using a low density parity check LDPC code built controlling a local girth and a global girth.

A transmitter is shown that includes one or more low density parity check (LDPC) encoders, each configured to encode one or more streams of input data using an LDPC code built by modified progressive edge growth to produce one or more encoded data streams, a mapper, configured to map the one or more encoded data streams to symbols, and a modulator configured to modulate the symbols onto a first optical carrier beam.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

To strike a middle ground between performance and ease of implementation, low density parity check (LDPC) codes based on a modified progressive edge-growth (MPEG) method are used instead of quasi-cyclic (QC) LDPC codes. The PEG method establishes the connections between bit and check nodes in the corresponding bipartite (Tanner) graph representation of a parity-check matrix in an edge-by-edge fashion. Because the PEG method is a best effort method, it is highly flexible in comparison with various QC-LDPC code designs. Using the MPEG method according to the present principles, LDPC codes can be designed that have high performance and yet are also easy to implement.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
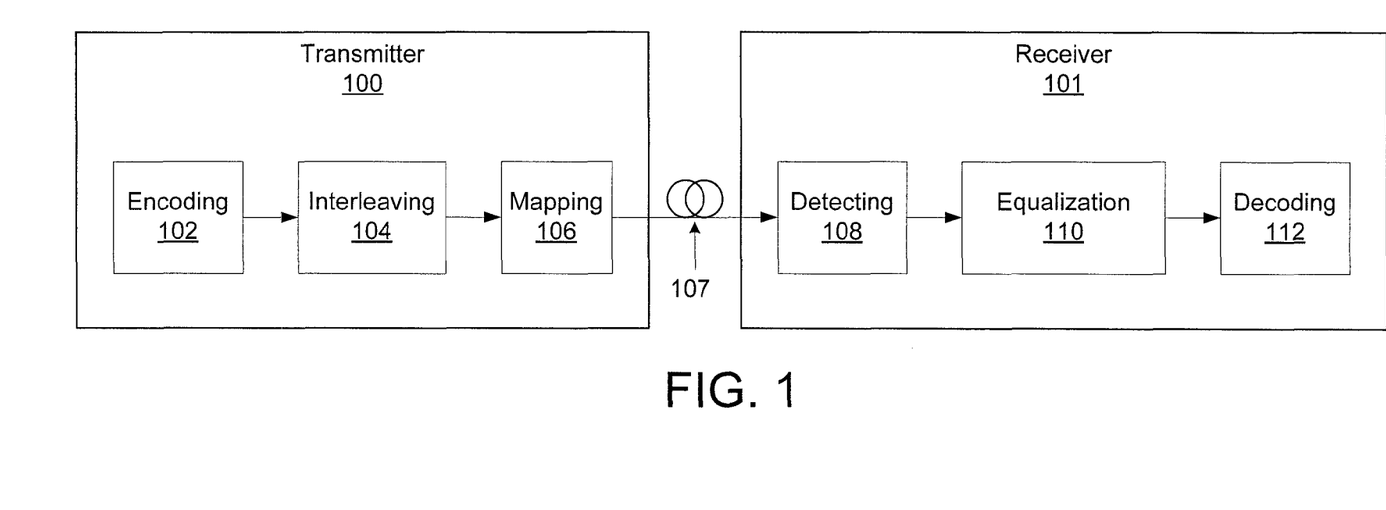
FIG. 1 shows a block diagram illustrating an optical transmission system.

Referring now to the drawings in which like numerals represent the same or similar elements and initially to FIG. 1, an optical communications system is shown comprising a transmitter 100 and a receiver 101. The transmitter encodes a plurality of data signals at the encoder block 102 and then interleaves those signals at interleaving block 104. The mapping block 106 then assigns bits of the interleaved signal to an iterative polarization modulation constellation, associating the bits of the interleaved data signals with the points on an iterative polar quantization (IPQ) constellation. The transmitter 100 then sends the signal to receiver 101 over an optical medium 107, which may include periodically deployed erbium doped fiber (EDF) amplifiers to maintain the signal strength. Other embodiments include the use of Raman and hybrid Raman/EDF amplifiers. Receiver 101 detects symbols in the IPQ constellation at block 108. A backpropagation and equalization block 110 performs coarse digital backpropagation and turbo equalization to compensate for channel impairments such as polarization mode dispersion, chromatic dispersion, and fiber non-linearities. The signals are then de-interleaved and decoded at block 112 to produce the original data signals.

The encoders and decoders make use of LDPC codes to provide error correction that brings the transmissions close to the channel capacity. Every communications channel has a channel capacity, defined as the maximum information rate that the communication channel can carry within a given bandwidth. LDPC codes employ iterative belief propagation techniques that enable decoding in time that is proportional to their block length. However, choice of parity matrix can greatly affect the effectiveness of the LDPC code. The present principles provide an MPEG method for creating LDPC codes that have higher code rates and larger girths compared to codes generated by PEG, producing high-performance codes that are suitable for use in optical communications.

The modified progressive edge growth (MPEG) method can be formulated as follows: given (n−k) and bit-node degree distribution, design an (n−k)×n parity-check matrix with girth g≧8 and code rate R=k/n≧0.8. Several definitions facilitate the description of the MPEG method. A regular (n, k) LDPC code is a linear block code having a parity-check matrix H that includes exactly $W_c$ ones per column and exactly $W_r=W_c$ (n/(n−k)) ones per row, where Wc<<(n−k). If H is low density, but the number of ones per column or row is not constant, the corresponding code is an irregular LDPC code. The sum-product method (SPA) is an iterative LDPC decoding method in which extrinsic probabilities are iterated forward and back between variable and check nodes of bipartite (Tanner) graph representation of a parity-check matrix. The Tanner graph of an LDPC code is drawn according to the following rule: check node c is connected to variable node v whenever element $h_{cv}$ in H is a one. The code description can also be done by the degree distribution polynomials λ(x) and ρ(x), for the v-node and the c-node respectively $$\lambda(x) = \sum_{d=1}^{d_v} \lambda_d x^{d-1}, \rho(x) = \sum_{d=1}^{d_c} \rho_d x^{d-1},$$

where $\lambda_d$ and $\rho_d$ denote the fraction of the edges that are connected to degree-d v-nodes and c-nodes respectively, and $d_v$ and $d_c$ denote the maximum v-node and c-node degrees respectively. For $v_i$-node, the neighborhood $N(v_i)$ is defined as the set of c-nodes connected to it. The neighborhood of $v_i$-node at depth t is denoted by $N^{(t)}(v_i)$, and the complement of $N^{(t)}(v_i)$ (the set of c-nodes not connected to $v_i$-node) by $\overline{N}^{(t)}(v_i)$.

Figure 2:
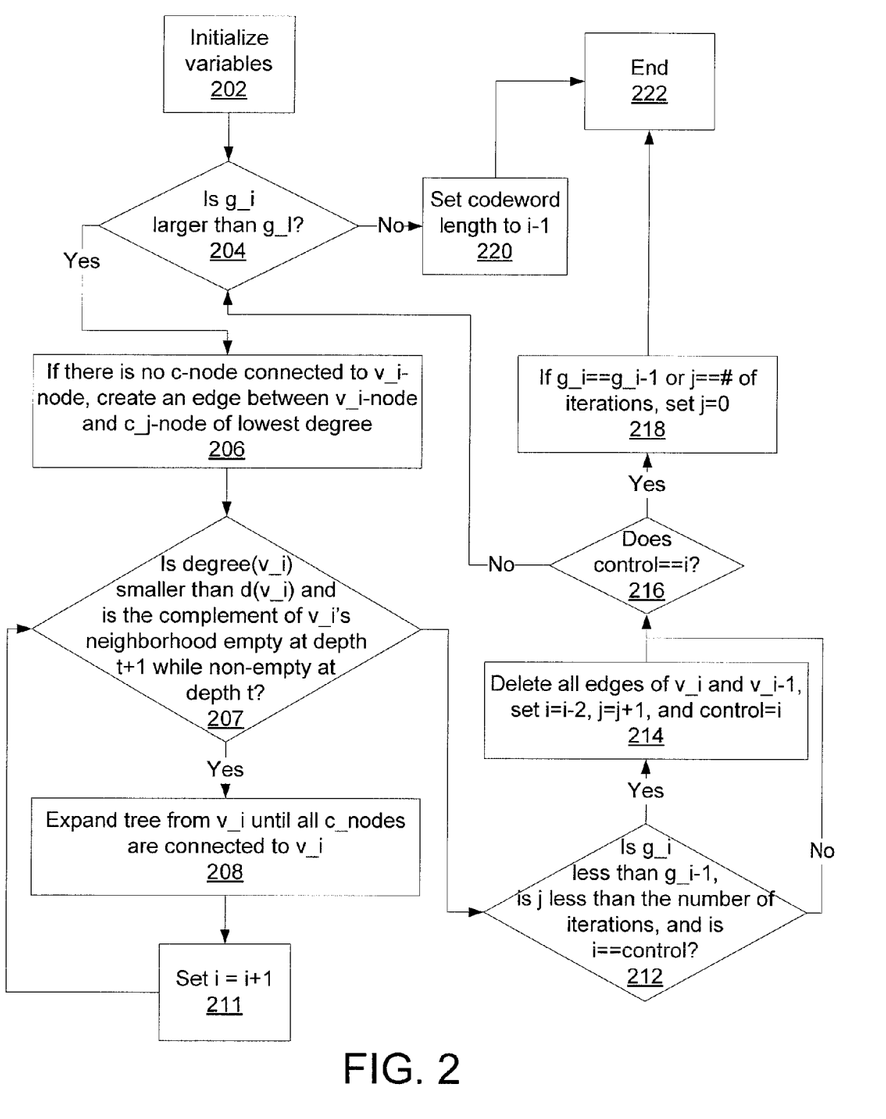
FIG. 2 shows a block/flow diagram that illustrates a modified progressive edge growth method for creating LDPC codes suitable for optical transmission.

Referring now to FIG. 2, a system/method for creating an (n,k) LDPC code according to the present principles is shown. Variable are initialized at block 202. In particular, the target girth $g_{tg}$, the lowest tolerable girth $g_l$, a desired v-nodes degree distribution $\{d(v_i)\}$, and the maximum number of iterations (# iter) are all specified while iterators i and j as well as a control parameter control are set to zero. $g_i$ is initially set to the target girth $g_{tg}$. A number of parity checks, m, is specified. A loop then begins at block 204, determining whether the current $g_i$ is greater than or equal to the lowest tolerable girth $g_l$.

If the current girth does not equal the lowest tolerable girth, block 206 creates an edge between variable node $v_i$-node and the check node $c_j$-node having the lowest degree. A new loop begins at block 207, determining whether the degree of $v_i$ is equal to the v-node degree distribution $d(v_i)$ and further whether $\overline{N}^{(t+1)}(v_i)=\emptyset$ and $\overline{N}^{(t)}(v_i)\neq\emptyset$. If so, block 208 expands the tree at v-node $v_i$ until all c-nodes are connected to $v_i$. If the cardinality of $N^{(t)}(v_i)$ saturates (in other words, when said cardinality is equal to m), an edge is created between $v_i$ and the c-node of lowest degree from $\overline{N}^{(t)}(v_i)$ at block 208. Returning to block 207, if the degree of $v_i$ is still smaller than $d(v_i)$, i is incremented at block 211 and the loop repeats at block 208 with the next v-node.

If the local girth starts to deteriorate, block 212 determines whether the current overall girth $g_i$ is less than the next girth $g_{i-1}$, whether j is less than the maximum number of iterations, and whether i is equal to control. If so, all of the edges of nodes $v_i$ and $v_{i-1}$ are deleted at block 214, i is reduced by two, j is incremented by one, and control is set to equal i. Block 212 determines when a change has gone too far, indicating that an acceptable code has been created. Block 214 then backs out that change and sets the control variable to indicate that the method can end.

Block 216 then determines whether control variable is set to i. If so, block 218 sets j to zero if $g_i$ is the same as $g_{i-1}$ or j has reached the maximum number of iterations. At this point, the loop ends at block 222. If block 216 determines that the control variable is not set to i, the loop returns to block 204 to determine whether the current girth gi is equal to the lowest tolerable girth. When that condition is reached, block 220 sets codeword length to i−1 and the method ends at block 222. MPEG thereby controls both a local girth (that is, the shortest cycle at a particular point in the graph) as well as the global girth (the shortest cycle in the graph as a whole).

Figure 3:
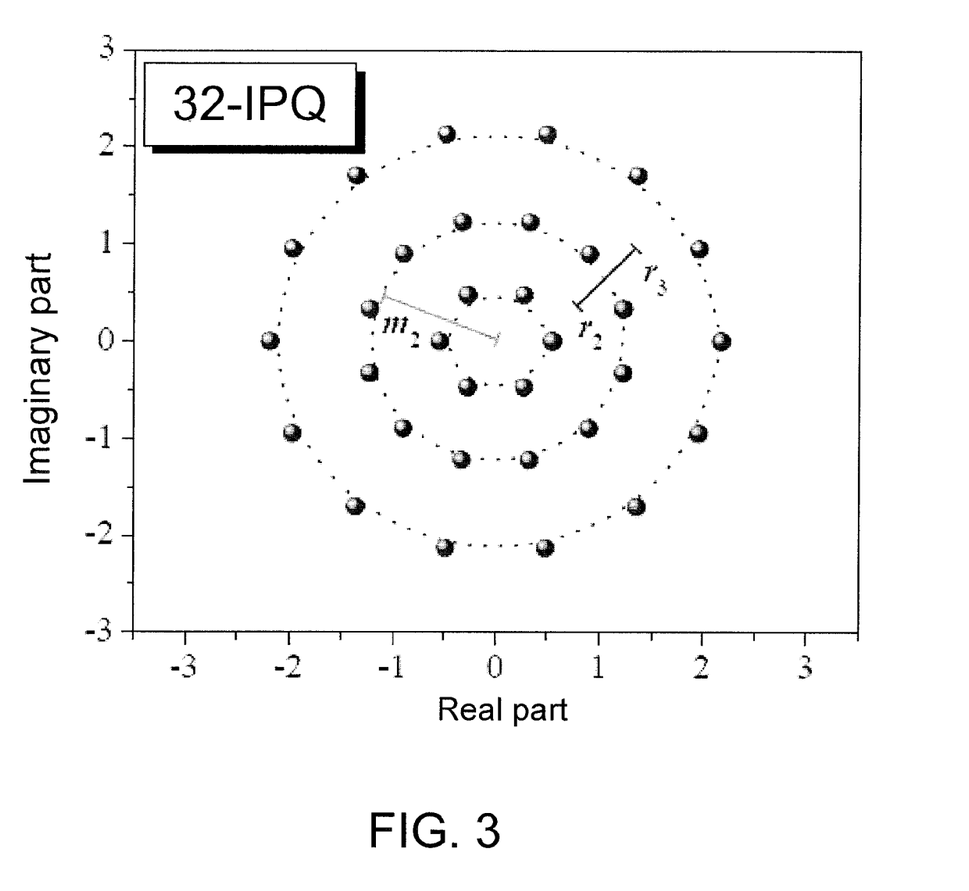
FIG. 3 shows a 32-iterative polar quantization (IPQ) constellation.

The resulting graph is then used in the LDPC encoders 102 and decoders 112 to implement the error correcting code. In addition to encoding, transmission benefits from the use of an effective modulation scheme. For example, iterative polar quantization (IPQ) produces a non-uniform constellation that fits a Gaussian source distribution and provides superior performance. Referring now to FIG. 3, an exemplary IPQ constellation is shown. The constellation is an example of 32-IPQ, where the axes represent a real (in-phase) signal and an imaginary (quadrature) signal. The constellation shown in FIG. 3 is represented by Table 1 below:

TABLE 1

| i   | 1     | 2     | 3     | 4   |
|-----|-------|-------|-------|-----|
| $r_i$ | 0     | 0.896 | 1.733 | 4.5 |
| $m_i$ | 0.547 | 1.269 | 2.181 |     |
| $L_i$ | 6     | 12    | 14    |     | where L is the total number of signal constellation points, $L_i$ is the number of constellation points in each circle having radius $m_i$, and $r_i$ represents limits of integration used in the calculation of the points. The IPQ constellations benefit from a non-uniform distribution, where the points in outer rings are spaced farther apart than the inner rings. This non-uniform distribution provides a better fit to an optimum Gaussian source distribution than a uniform distribution would because it provides superior compensation for the drift in I and Q values that noise introduces. The correspondence between bit sequences and constellation positions may be stored and retrieved from a stored lookup table. The lookup tables are generated in advance by the techniques described above and are included in both the transmitter 100 and the receiver 101.

IPQ constellations are determined based on the minimum quantization mean squared error (QMSE). The optimum source distribution for Gaussian channels, such as ASE noise-dominated channels, is Gaussian. The in-phase $s_I$ and quadrature $s_Q$ components of Gaussian random constellation vector $s=(s_I, s_Q)$ follow a 2-D distribution with zero mean. Corresponding polar coordinates of this signal constellation are given by:

$$s = |s|e^{j\theta}, |s| = \sqrt{s_I^2 + s_Q^2}, \theta = \tan^{-1}\frac{s_Q}{s_I},$$

with the distribution of envelope |s| being Rayleigh and the distribution of θ being uniform.

For a Gaussian source, the distribution of ring radii is selected to be Rayleigh and the signal constellation is obtained by quantizing the source while minimizing QMSE. This is achieved using restricted iterative polarization quantization (IPQ) that includes a non-uniform scalar quantization of the amplitude and a uniform scalar quantization of the phase. The number of points on each ring is selected iteratively for all the concentric rings.

Let $L_i$ denote the number of constellation points per circle of radius $m_i$. The optimum number of constellation points per $i^{th}$ circle is determined by minimizing the QMSE by:

$$L_i = \sqrt[3]{m_i^2 \int_{r_i}^{r_{i+1}} p(r)dr} \bigg/ \left[\sum_{i=2}^{L_r} \frac{1}{L} \sqrt[3]{m_i^2 \int_{r_i}^{r_{i+1}} p(r)dr}\right]; \quad (1)$$

$$i = 1, 2, \ldots, L_r$$

where $L_r$ is the number of circles in the constellation, L is the total number of signal constellation points ($L = \sum_{i=2}^{L_r} L_i$) and p(r) is Rayleigh distribution function for probability $$p(r) = \frac{r}{\sigma^2} e^{-\frac{r^2}{2\sigma^2}}, \text{ for } r \geq 0,$$

where $\sigma^2$ represents the source power.

The radius of the $i^{th}$ ring is determined as:

$$m_i = 2\sin(\Delta\theta_i/2) \int_{r_i}^{r_{i+1}} rp(r)dr \bigg/ \Delta\theta_i \int_{r_i}^{r_{i+1}} p(r)dr, \quad (2)$$

$$\Delta\theta_i = \frac{2\pi}{L_i}, i = 1, 2, \ldots, L_r.$$

The limits of integration in equations (1) and (2) are determined by:

$$r_i = \pi(m_i^2 - m_{i-1}^2)/2[m_i L_i \sin(\Delta\theta_i/2) - m_{i-1}L_{i-1}\sin(\Delta\theta_{i-1}/2)], i=1,2,\ldots,L_r \quad (3)$$

The Rayleigh distribution is used because the envelope r of a two-dimensional (zero-mean) Gaussian distribution with coordinates $r_I$ and $r_Q$ (representing in-phase and quadrature components), determined by $r = \sqrt{r_I^2 + r_Q^2}$, conforms to a Rayleigh probability distribution. As the iterative process proceeds, applying equations (1)-(3) until convergence, the number of rings, the radius of each ring, and the number of points on each ring are determined and stored.

Figure 4:
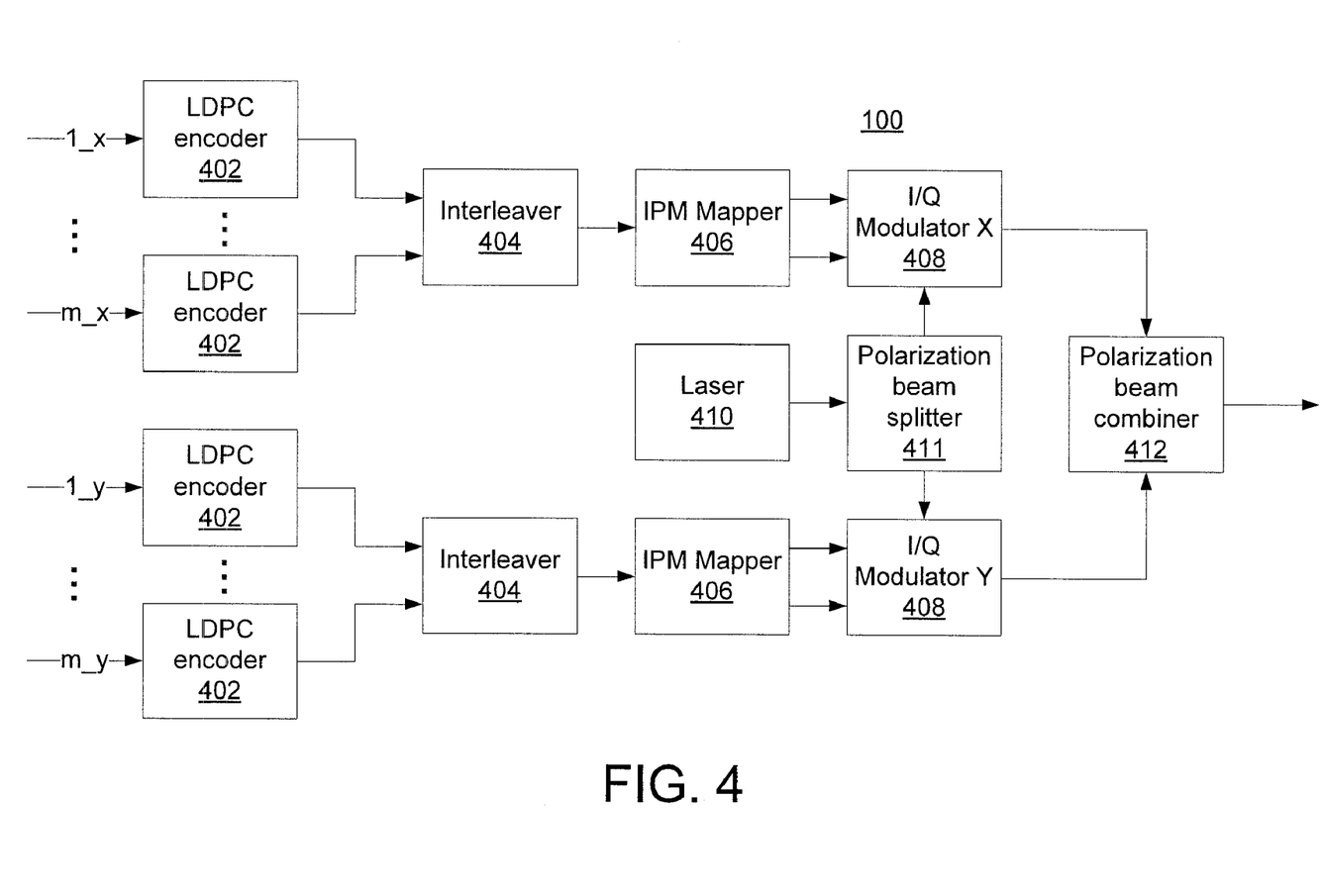
FIG. 4 shows a block diagram illustrating an optical transmitter that employs MPEG-based LDPC codes.

Referring now to FIG. 4, a detailed view of transmitter 100 is shown. 2m data signals feed into the transmitter. The data signals are divided into m signals to be put on an x polarization and m signals for a y polarization. FIG. 4 illustrates two separate branches, one for each of the respective polarization, and m signals for each branch. Although the branches are described herein as having equal numbers of input data signals, the branches may also accept different numbers of inputs. The data streams are encoded at LDPC encoders 402 using different LDPC codes having code rates $R_i = K_i/N$ (i∈{x, y}), where $K_i$ denotes the number of information symbols used in the binary LDPC code corresponding to each polarization and N denotes the codeword length, where both LDPC codes have the same codeword length.

The 2m input bit streams from 2m different information sources pass through identical LDPC encoders 402 that use large-girth quasi cyclic LDPC codes $R_i$. The outputs of the encoders are then bit-interleaved by an m×n bit-interleaver 404, where the sequences are written row-wise and read column-wise. The output of the interleaver 404 is sent in one bit-stream, m bits at a time instant i, to a mapper 406.

The mappers 406 map each m bits into a $2^m$-ary IPQ signal constellation point based on a lookup table, as explained above. The mapper 406 constellation point assigns constellation points $s_i = (I_i, Q_i) = |s_i|\exp(j\phi_i)$, with the mapped coordinates from the mapper 406 being used as the inputs of an I/Q modulators 408. A laser 410 produces a carrier beam that is split at polarization beam splitter 411 into two orthogonal polarizations. The I/Q modulators 408 modulate the constellation points onto the orthogonally polarized carrier beams. The beams from the respective branches of the transmitter 100 are then combined in beam combiner 412 before being transmitted on an optical fiber. Because the combined beams occupy polarizations that are orthogonal with respect to one another, they can be combined without loss of information.

Figure 5:
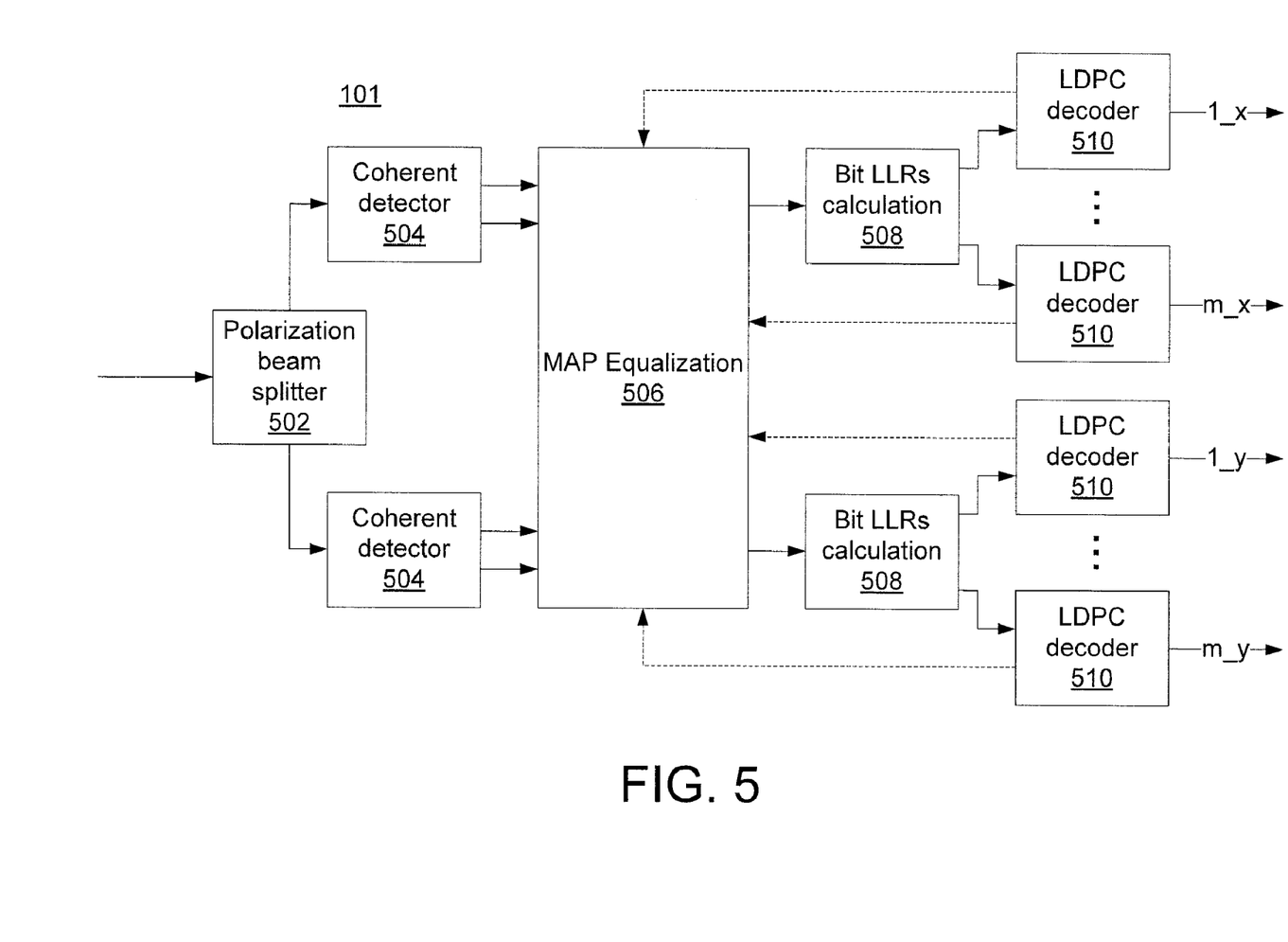
FIG. 5 shows a block diagram illustrating an optical receiver that employs MPEG-based LDPC codes.

Referring now to FIG. 5, a detailed view of the receiver 101 is shown. A carrier beam is received from an optical fiber and is split at beam splitter 502 into two orthogonal polarizations. Detectors 504 demodulate the beams to produce I and a Q signal estimates by sampling their respective signals. Although detectors 504 are advantageously implemented as coherent detectors, it is contemplated that other sorts of detector might be used. In embodiments that employ coherent detection, a local laser source (not shown) is used to provide the detectors 504 with a local reference that allows them to quickly distinguish between the orthogonal polarizations and extract the information.

The I and Q signals produced by the detectors 504 then pass to the MAP equalization module 506, where various channel impairments are corrected. The data stream is then passed to bit log likelihood ratio (LLR) modules 508. The bit LLR modules 508 determine the bit LLRs from symbol LLRs. The bit LLR modules 508 include a lookup table that stores the same constellation information as the lookup table at the transmitter, allowing the bit LLR modules 508 to convert symbols to bit sequences. The symbol LLRs are defined as $\lambda(s)=\log [P(s|r)/P(s_0|r)]$, where $s=(I_i,Q_i)$ and $r=(r_I,r_Q)$ denote the transmitted signal constellation point and received symbol at time instance i respectively, and $s_0$ represents the reference symbol are determined in block 506.

The bit LLR modules 508 each produce m bit LLRs which are processed by m LDPC decoders 510. The bit reliabilities for LDPC decoders 510 are calculated from symbol reliabilities. To improve bit error rate (BER) performance, EXIT chart analysis is used and extrinsic reliabilities are iterated between maximum a posteriori (MAP) equalizer and LDPC decoders 510 in turbo equalization fashion until convergence or until a predetermined number of iterations has been reached. The MAP equalizers form a part of the turbo equalizer in block 506. One advantageous embodiment of a MAP equalizer uses the Bahl-Cocke-Jelinek-Raviv (BCJR) method. Another uses a soft-output viterbi method (SOYA) for equalization. The LDPC decoders 510 then produce the original 2m data signals as output and feed back extrinsic LLR information to the turbo equalizers in block 506.

Figure 6:
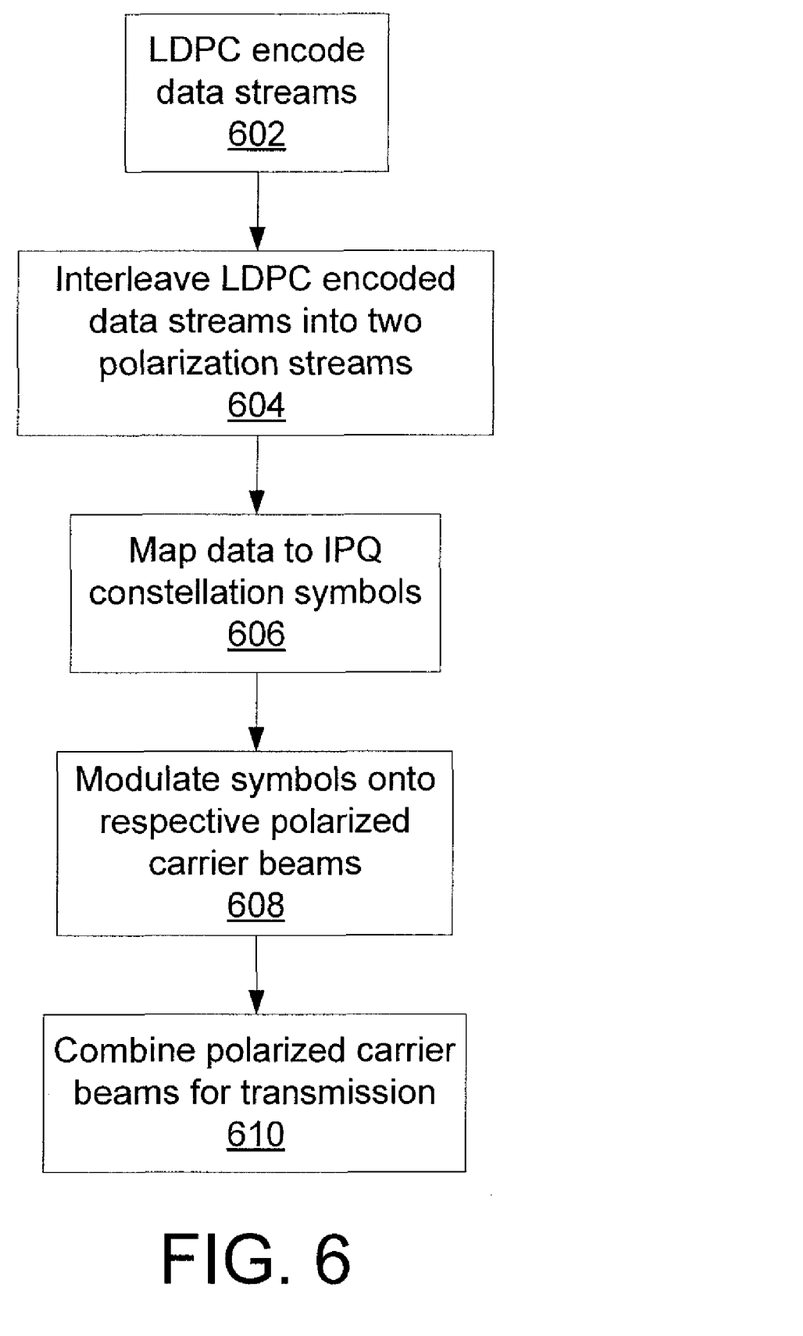
FIG. 6 shows a block/flow diagram illustrating a system/method for transmitting data using MPEG-based LDPC codes.

Referring now to FIG. 6, a system/method for encoding and modulating data for transmission using MPEG-based LDPC codes with IPQ modulation is shown. These methods provide for very high transmission rates, in excess of 400 Gb/s, over long distances. A plurality of data streams are encoded at block 602 using an MPEG-based LDPC code having a girth of at least 8 and a code rate of at least 0.8. The encoded streams are then interleaved at block 604 into two separate polarization streams, representing the two orthogonal polarizations that are to be multiplexed.

The interleaved streams can then be mapped to the symbols of an IPQ constellation, such as those described above, at block 606, providing in-phase and quadrature values that identify particular symbols. The I and Q values for each set of symbols are used to modulate the symbols onto orthogonally polarized carrier beams via phase modulation at block 608 before those polarized carrier beams are combined into a single beam for transmission at block 610. The combined carrier beam can then be transmitted over an optical fiber to its destination.

Figure 7:
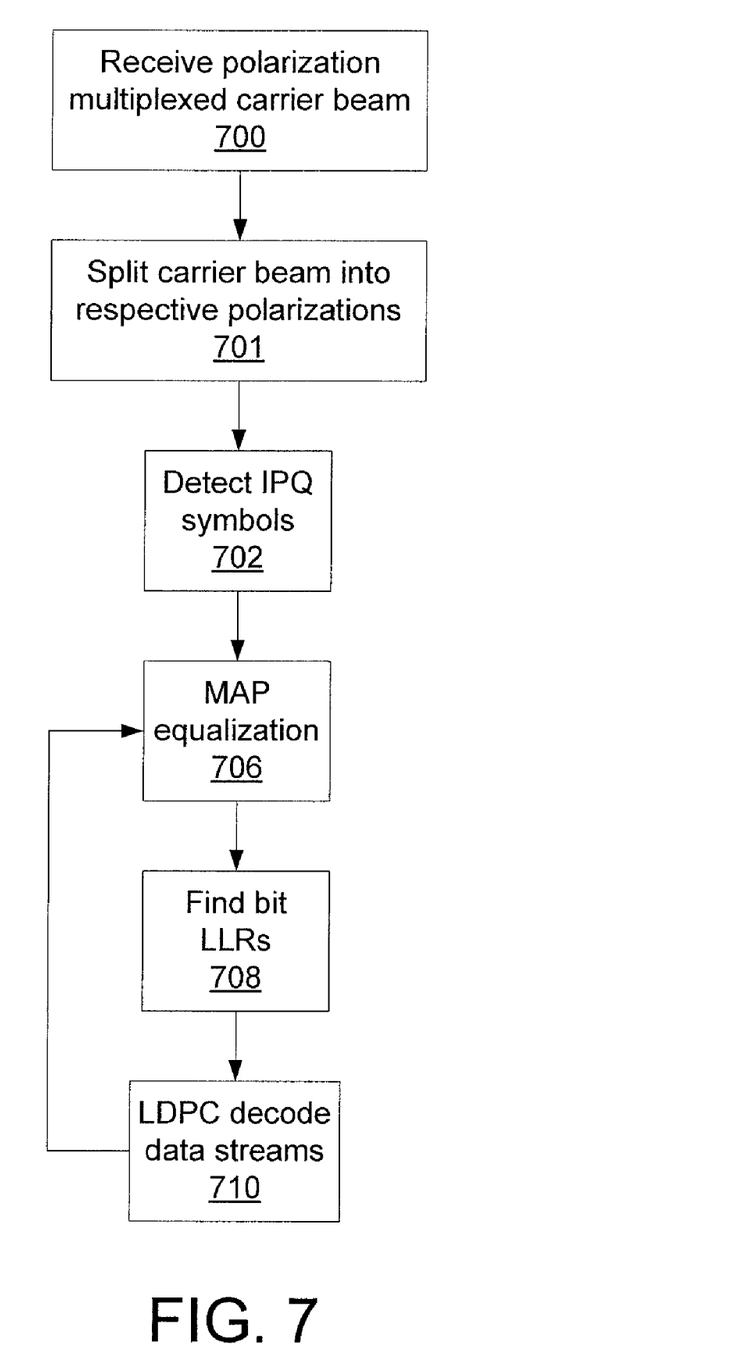
FIG. 7 shows a block/flow diagram illustrating a system/method for receiving and decoding data using MPEG-based LDPC codes.

Referring now to FIG. 7, a system/method for receiving and decoding received data is shown. A combined carrier beam is received from an optical transmission fiber at block 700 and is then split into two orthogonal polarizations at block 701. IPQ symbols are then detected and extracted from the carrier beams at block 702. It is contemplated that any method of detection could be used, but for the purposes of example and discussion coherent detection is used herein.

Channel distortions are compensated for using turbo equalization in block 706. The symbols are converted to bit streams and the bit LLRs for the streams are calculated at block 708. These bit LLRs are used to decode the LDPC encoded data at block 710. At block 712, extrinsic LLR information is passed back from the LDPC decoding to be used in subsequent turbo equalizations.

The MPEG method produces LDPC codes that outperform QC LDPC codes and significantly outperforms turbo-product codes. MPEG-based LDPC codes eliminate the "error floor" phenomenon in the region of interest for optical communications, where performance increases diminish past a certain signal-to-noise ratio, and are suitable for communications at and beyond 100 Gb/s per wavelength.

Having described preferred embodiments of a system and method for modified progressive edge-growth LDPC codes for ultra-high-speed serial optical transport (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for receiving, comprising:
receiving a modulated, encoded input stream;
detecting symbols in the input stream;
equalizing the input stream to reduce channel impairments; and
decoding the stream of encoded data with one or more low density parity check (LDPC) decoders using an LDPC code built by controlling a local girth relating to a shortest cycle at a particular point in a graph for an LDPC code and a global girth relating to the shortest cycle in the entire graph for the LDPC code.

2. The method of claim 1, wherein the LDPC code is built by iteratively expanding trees from each variable node until all check nodes are connected to the respective variable node.

3. The method of claim 1, wherein the LDPC code has a girth of at least 8 and a code rate of at least 0.8.

4. The method of claim 1, wherein the symbols are detected using an iterative polar quantization (IPQ) constellation that conforms to a non-uniform, polar constellation having a Gaussian source distribution to produce a stream of encoded data.

5. The method of claim 1, wherein said equalizing includes iterating extrinsic LLRs between a maximum a posteriori (MAP) equalizer and the one or more LDPC decoders until convergence or until predetermined number of iterations has been reached.

6. The method of claim 1, further comprising:
receiving an optical carrier beam; and
splitting the optical carrier beam into two orthogonal polarizations, each having a modulated, encoded input stream.

7. The method of claim 1, wherein the graph comprises a Tanner graph and wherein the Tanner graph of an LDPC code is drawn according to the following rule: check node c is connected to variable node v whenever element $h_{cv}$ in H is a one with degree distribution polynomials $\lambda(x)$ and $\rho(x)$, for the v-node and the c-node respectively $$\lambda(x) = \sum_{d=1}^{d_v} \lambda_d x^{d-1}, \rho(x) = \sum_{d=1}^{d_c} \rho_d x^{d-1},$$

where $\lambda_d$ and $\rho_d$ denote the fraction of the edges that are connected to degree-d v-nodes and c-nodes respectively, and $d_v$ and $d_c$ denote the maximum v-node and c-node degrees respectively.

8. A method for transmitting, comprising:
encoding one or more streams of input data with one or more low density parity check encoders configured to apply a low density parity check (LDPC) code built by controlling a local girth relating to a shortest cycle at a particular point in a graph for an LDPC code and a global girth relating to the shortest cycle in the entire graph for the LDPC code to produce one or more encoded data streams;
mapping the one or more encoded data streams to symbols; and
modulating the symbols onto an optical carrier beam.

9. The method of claim 8, wherein the LDPC code is built by iteratively expanding trees from each variable node until all check nodes are connected to the respective variable node.

10. The method of claim 8, wherein the LDPC code has a girth of at least 8 and a code rate of at least 0.8.

11. The method of claim 8, wherein symbols are mapped using a non-uniform, polar iterative polar quantization (IPQ) based constellation derived from a Gaussian source distribution.

12. The method of claim 8, further comprising:
modulating the symbols onto two orthogonally polarized carrier beams; and
combining the orthogonally polarized carrier beams into a combined carrier beam.

13. A receiver, comprising:
one or more detectors, each configured to extract symbols from a carrier beam and to output a coded stream;
one or more log likelihood ratio (LLR) modules configured to generate LLR information for the respective coded streams, each comprising a lookup table configured to store correspondences between bit sequences and the symbols; and
one or more decoder, each configured to accept a coded stream and the associated LLR information and to produce a decoded data stream using a low density parity check (LDPC) code built by controlling a local girth relating to a shortest cycle at a particular point in a graph for an LDPC and a global girth relating to the shortest cycle in the entire graph for the LDPC code.

14. The method receiver of claim 13, wherein the LDPC code is built by iteratively expanding trees from each variable node until all check nodes are connected to the respective variable node.

15. The receiver of claim 13, wherein the LDPC code has a girth of at least 8 and a code rate of at least 0.8.

16. The receiver of claim 13, comprising:
a beam splitter configured to accept a transmission carrier beam and split the transmission carrier beam into two orthogonally polarized carrier beams; and
two detectors configured to receive the respective polarized carrier beams and to output data signals.

17. A transmitter, comprising:
one or more low density parity check (LDPC) encoders, each configured to encode one or more streams of input data using an LDPC code built by controlling a local girth relating to a shortest cycle at a particular point in a graph for an LDPC and a global girth relating to the shortest cycle in the entire graph for the LDPC code to produce one or more encoded data streams;
a mapper configured to map the one or more encoded data streams to symbols; and
a modulator configured to modulate the symbols onto a first optical beam.

18. The transmitter of claim 17, wherein LDPC code is built by iteratively expanding trees from each variable node until all check nodes are connected to the respective variable node.

19. The transmitter of claim 17, wherein the LDPC code has a girth of at least 8 and a code rate of at least 0.8.

20. The transmitter of claim 17, further comprising:
a second mapper configured to configured to map the one or more encoded data streams to symbols;
a second modulator configured to modulate the symbols onto a second optical beam that is orthogonally polarized with respect to the first optical beam; and
a polarization beam combiner configured to combine the first optical beam and the orthogonally polarized second optical beam into a combined carrier beam.

* * * * *